United States Patent
Matsuda et al.

(10) Patent No.: US 11,187,993 B2
(45) Date of Patent: Nov. 30, 2021

(54) EXPOSURE APPARATUS AND METHOD OF MANUFACTURING ARTICLE

(71) Applicant: CANON KABUSHIKI KAISHA, Tokyo (JP)

(72) Inventors: Yutaka Matsuda, Shimotsuke (JP); Kimitoshi Tamaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/371,271

(22) Filed: Apr. 1, 2019

(65) Prior Publication Data
US 2019/0302630 A1 Oct. 3, 2019

(30) Foreign Application Priority Data
Apr. 3, 2018 (JP) .............................. JP2018-071919

(51) Int. Cl.
*G03F 7/20* (2006.01)
*G03F 9/00* (2006.01)

(52) U.S. Cl.
CPC ........ *G03F 7/70533* (2013.01); *G03F 7/7085* (2013.01); *G03F 7/70633* (2013.01); *G03F 7/70683* (2013.01); *G03F 9/7084* (2013.01)

(58) Field of Classification Search
CPC ............. G03F 7/70483; G03F 7/70491; G03F 7/70508; G03F 7/70516; G03F 7/70525;
(Continued)

(56) References Cited
U.S. PATENT DOCUMENTS
6,344,892 B1 * 2/2002 Sugita ................. G03F 7/70408
355/53
6,838,217 B1 1/2005 Chen
(Continued)

FOREIGN PATENT DOCUMENTS
CN 105573068 A 5/2016
JP H11307449 A 11/1999
(Continued)

OTHER PUBLICATIONS
Office Action issued in Taiwanese Appln. No. 108109682 dated Sep. 29, 2020. English translation provided.
(Continued)

*Primary Examiner* — Christina A Riddle
(74) *Attorney, Agent, or Firm* — Rossi, Kimms & McDowell LLP (57) ABSTRACT

The present invention provides an exposure apparatus including a forming unit configured to form a mark on a resist film on a substrate, and a control unit configured to perform an exposure process to form a latent image by projecting a pattern onto a target position on the resist film on the substrate based on a measured position of the mark, wherein the control unit causes the forming unit to perform a formation process of forming, before the exposure process is performed on a reworked substrate on which a second resist film has been formed after removing a first resist film with a first mark, a second mark on the second resist film so the second mark will be positioned at a position shifted from a position of the first mark on the reworked substrate.

13 Claims, 7 Drawing Sheets

(58) Field of Classification Search
CPC ............ G03F 7/70533; G03F 7/70541; G03F 7/70608; G03F 7/70616; G03F 7/70633; G03F 7/7065; G03F 7/70666; G03F 7/70675; G03F 7/70683; G03F 7/70775; G03F 7/7085; G03F 7/70991; G03F 7/70035; G03F 7/2022; G03F 7/2026; G03F 7/2024; G03F 7/22; G03F 7/70458; G03F 7/70466; G03F 7/70475; G03F 9/7084; G03F 9/7007; G03F 9/7011; G03F 9/7015; G03F 9/7069; G03F 9/708; G03F 9/7088; G03F 7/20; G03F 9/7046; H01L 21/027
USPC ......... 355/18, 30, 46, 52, 53–55, 67–74, 77; 250/492.1, 492.2, 492.22, 492.3, 493.1, 250/503.1; 430/8, 19, 21, 22, 30, 269, 430/270.1, 311, 312, 327, 329, 394, 432, 430/494

See application file for complete search history.

(56) References Cited

U.S. PATENT DOCUMENTS

| | | | |
|---|---|---|---|
| 8,889,434 B2* | 11/2014 | Tsen | G03F 9/7003 438/7 |
| 9,442,392 B2* | 9/2016 | Tsen | H01L 21/0274 |
| 2003/0025895 A1 | 2/2003 | Binnard | |
| 2004/0023466 A1 | 2/2004 | Yamauchi | |
| 2006/0216649 A1* | 9/2006 | Paxton | G03F 7/0035 430/311 |
| 2009/0153826 A1* | 6/2009 | Sewell | G03F 7/70466 355/67 |
| 2010/0063764 A1* | 3/2010 | Lou | G05B 19/41875 702/94 |
| 2010/0291477 A1* | 11/2010 | Ishigo | G03F 7/70633 430/5 |
| 2016/0131983 A1 | 5/2016 | Holovinger | |
| 2019/0056673 A1* | 2/2019 | Li | G03F 7/70641 |

FOREIGN PATENT DOCUMENTS

| | | |
|---|---|---|
| JP | 2006303504 A | 11/2006 |
| WO | 2008071296 A1 | 6/2008 |

OTHER PUBLICATIONS

Office Action issued in Chinese Appln. No. 201910263549.2 dated Jul. 7, 2021. English translation provided.

* cited by examiner

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

When a device (a semiconductor device, a liquid crystal display device, a thin-film magnetic head, or the like) is to be manufactured by using a photolithography technique, an exposure apparatus that transfers a pattern of a mask (reticle) to a substrate, which has been applied with a photoresist, by projecting the pattern onto the photoresist-applied substrate via a projection optical system is used.

In recent years, an exposure apparatus that forms a single-layer pattern by performing an exposure process on the layer over a plurality of times and adding latent image patterns formed in the respective exposure processes without performing a developing process has been proposed in Japanese Patent Laid-Open No. 11-307449. In such an exposure apparatus, alignment (AMF: Alignment Mark Former) marks are formed before the execution of the first exposure process, and the relative positions of the latent image patterns formed in the respective exposure processes are managed (controlled) based on these alignment marks.

In an exposure apparatus, there can be cases in which an abnormality occurs in the photoresist applied on the substrate, that is, the resist film or in the exposure condition (exposure state) at the time of an exposure process. In such a case, a process of removing the already applied resist film from the substrate and reapplying (regenerating) a resist film on the substrate is performed to prevent the generation of a defect in a device to be manufactured from this substrate. Such a substrate that has undergone resist film regeneration is called a "reworked substrate" and is reused.

However, the influence of alignment marks that were formed before the rework may remain in a reworked substrate in some cases. This is because the properties of the surface of the substrate may have changed due to the formation of the alignment marks. Hence, due to the influence of the alignment marks formed before the rework, the detection accuracy of the alignment marks reformed on the reworked substrate can degrade, and the detection of the reformed alignment marks can become impossible.

SUMMARY OF THE INVENTION

The present invention provides an exposure apparatus advantageous in reusing a reworked substrate.

According to one aspect of the present invention, there is provided an exposure apparatus including a forming unit configured to form a mark on a resist film on a substrate, a measuring unit configured to measure a position of the mark formed by the forming unit, and a control unit configured to perform an exposure process to form a latent image by projecting a pattern onto a target position on the resist film on the substrate based on the position of the mark measured by the measuring unit, wherein the control unit causes the forming unit to perform a formation process of forming, before the exposure process is performed on a reworked substrate on which a second resist film has been formed after removing a first resist film with a first mark, a second mark on the second resist film so the second mark will be positioned at a position shifted from a position of the first mark on the reworked substrate.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

First Embodiment

Figure 1:
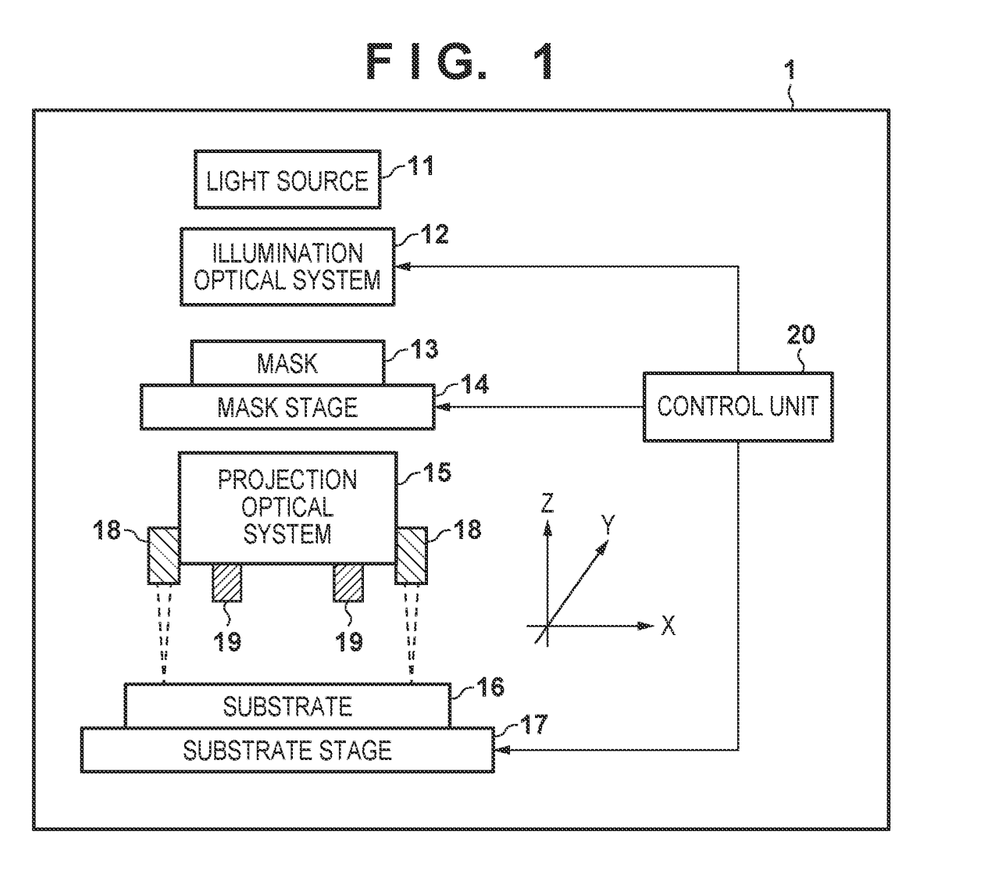
FIG. 1 is a schematic view showing the arrangement of an exposure apparatus as an aspect of the present invention.

FIG. 1 is a schematic view showing the arrangement of an exposure apparatus 1 as an aspect of the present invention. The exposure apparatus 1 is a lithography apparatus used in a photolithography process which is a manufacturing process of a device such as a semiconductor device or a liquid crystal display device. The exposure apparatus 1 performs an exposure process in which a latent image (latent image pattern) is formed on a resist film (photoresist) on a substrate by projecting a pattern of a mask onto the resist film on the substrate via a projection optical system. As shown in FIG. 1, the exposure apparatus 1 includes an illumination optical system 12, a mask stage 14, a projection optical system 15, a substrate stage 17, mark formation units 18, mark measurement units 19, and a control unit 20.

The illumination optical system 12 illuminates a mask 13 by using light from a light source 11. The mask stage 14 is a stage that can move while holding the mask 13. The projection optical system 15 forms a latent image pattern on a resist film on a substrate by projecting the pattern of the mask 13 which has been illuminated by the illumination optical system 12 onto the substrate. The substrate stage 17 is a stage that can move while holding a substrate 16. The mark formation units 18 form alignment marks (to be referred to as "AMF (Alignment Mark Former) marks" hereinafter) on the resist film on the substrate. The mark measurement units 19 measure the position of each AMF mark by detecting the AMF mark formed on the resist film on the substrate. The control unit 20 is formed from, for example, a computer including a CPU, a memory, and the like, and generally controls the units of the exposure apparatus 1 in accordance with the programs stored in a storage unit.

Figure 2:
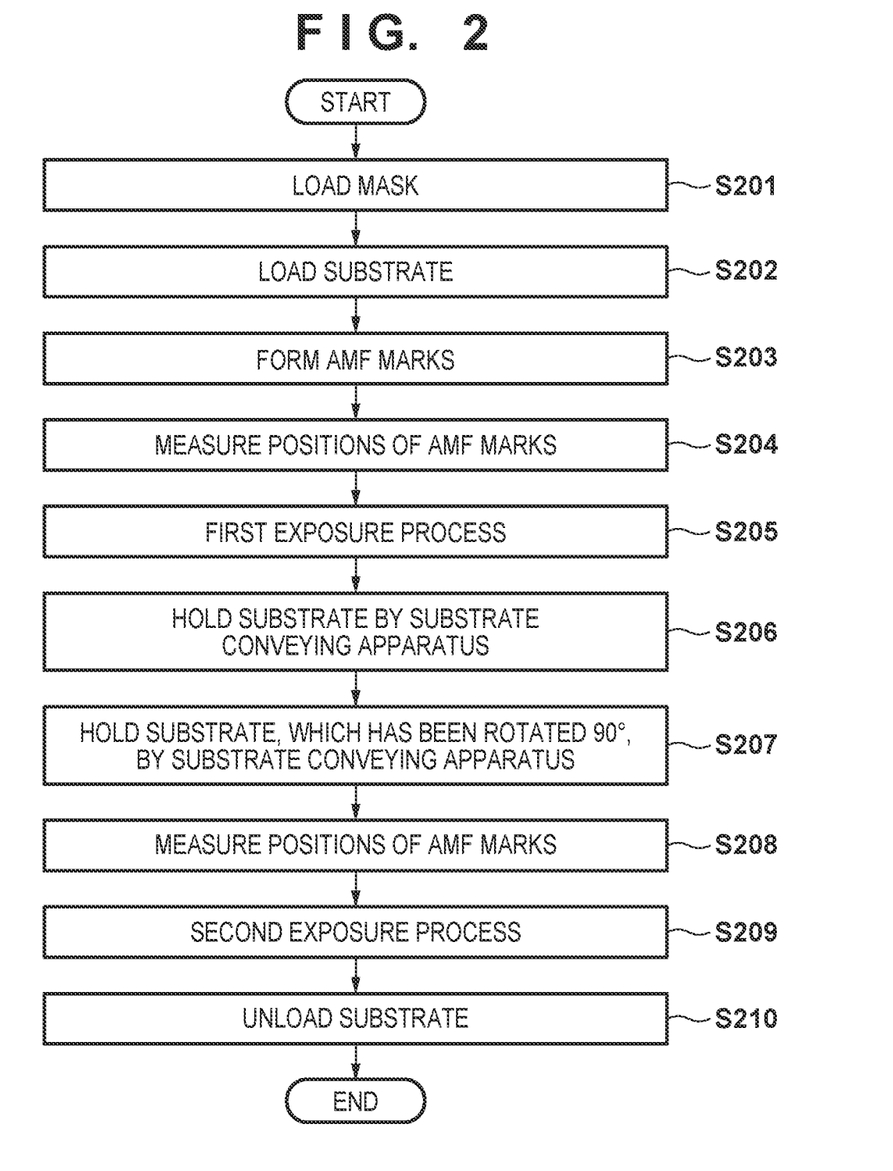
FIG. 2 is a flowchart for explaining a basic exposure process performed in the exposure apparatus shown in FIG. 1.

A basic exposure process performed in the exposure apparatus 1 will be described with reference to FIG. 2. A case in which a single-layer pattern is formed by performing an exposure process on a single layer twice (a plurality of times) and adding the latent image patterns formed in the respective exposure processes without performing a developing process will be exemplified here. In this case, AMF marks are formed on a resist film on a substrate before the execution of the first exposure process, and the relative positions of the latent image patterns to be formed in the respective exposure processes will be controlled (managed) by using the AMF marks as a reference.

In step S201, the mask 13 is loaded into the exposure apparatus 1. More specifically, a mask conveying apparatus (not shown) retrieves the mask 13 stored in a mask storage shelf and loads the mask 13 into the exposure apparatus 1 to make the mask stage 14 hold the mask.

In step S202, the substrate 16 is loaded into the exposure apparatus 1. More specifically, a substrate conveying apparatus (not shown) retrieves the substrate 16 stored in a pod and loads the substrate 16 into the exposure apparatus 1 to make the substrate stage 17 hold the substrate. Assume that a resist film has already been formed (applied) on the substrate 16.

In step S203, AMF marks are formed on the resist film on the substrate. More specifically, the substrate stage 17 which holds the substrate 16 is moved to an AMF mark formation position (below the mark formation units 18), and the AMF marks are formed on the resist film on the substrate by the mark formation units 18.

In step S204, the positions of the AMF marks formed in step S203 are measured. More specifically, the substrate stage 17 which holds the substrate 16 is moved to the AMF mark measurement position (below the mark measurement units 19), and the positions of the AMF marks formed on the resist film on the substrate are measured by the mark measurement units 19.

In step S205, the first exposure process is performed on the first layer. More specifically, the substrate stage 17 which holds the substrate 16 is moved to a position to expose the substrate 16, that is, a pattern projection position (below the projection optical system 15) of the mask 13 by using the measured AMF mark positions measured in step S204 as a reference. Subsequently, an exposure process to form a latent image pattern is performed by projecting the pattern of the mask 13 onto a target position (a partial region) on the resist film on the substrate.

In step S206, the substrate 16 that underwent the first exposure process in step S205 is collected from the substrate stage 17 and held by the substrate conveying apparatus (not shown). In step S207, the substrate 16 held in the substrate conveying apparatus is rotated 90°, and the substrate 16 is held by the substrate stage 17 in this state (that is, in a state in which the substrate has been rotated 90°).

In step S208, the positions of the AMF marks formed in step S203 are measured. More specifically, the substrate stage 17 which holds the substrate 16 that has been rotated 90° is moved to the AMF mark measurement position (below the mark measurement units 19), and the positions of the AMF marks formed on the resist film on the substrate are measured by the mark measurement units 19.

In step S209, the second exposure process on the first layer is performed. More specifically, the substrate stage 17 which holds the substrate 16 that has been rotated 90° is moved to the pattern projection position (below the projection optical system 15) of the mask 13 by using the positions of the AMF marks measured in step S208 as a reference. Subsequently, the exposure process to form a latent image pattern is performed by projecting the pattern of the mask 13 onto a target position (a region different from the region that underwent the first exposure process) on the resist film on the substrate.

In step S210, the substrate 16 is unloaded from the exposure apparatus 1. More specifically, the substrate conveying apparatus (not shown) collects the substrate 16 that underwent the first exposure process and the second exposure process from the substrate stage 17 and unloads the substrate from the exposure apparatus 1.

The details of steps S203, S204, S205, and S209 of the exposure process shown in FIG. 2 will be described with reference to FIGS. 3A to 3D. FIGS. 3A to 3D show the relative positional relationships between AMF marks 31, 32, and 33 formed on the resist film on the substrate, the mark measurement units 19, and a measuring range MR of the mark measurement units 19.

Figure 3A:
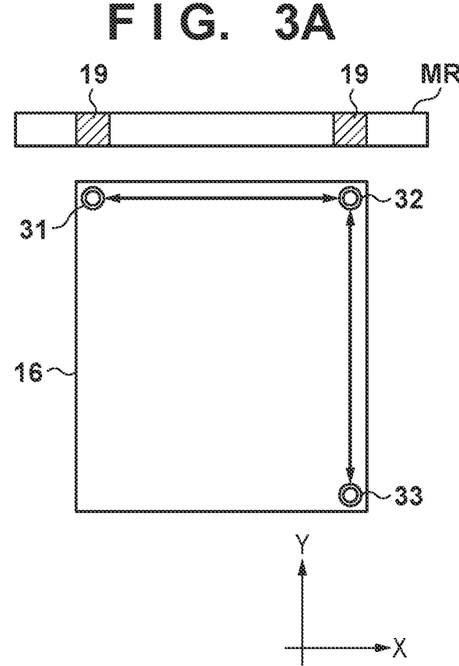
FIGS. 3A to 3D are views for explaining the details of steps S203, S204, S205, and S209 in the exposure process shown in FIG. 2.

As shown in FIG. 3A, before the execution of the first exposure process, the mark formation units 18 form, for example, the three AMF marks 31, 32, and 33 on the resist film on the substrate (step S203). The mark formation units 18 form, under the control of the control unit 20, the three AMF marks 31, 32, and 33 so that the marks will fall within the measuring range MR of the mark measurement units 19. The mark formation units 18 form the AMF marks 31, 32, and 33 by using light from a light source which is different from the light source 11 (that is, light of a wavelength different from the wavelength of light for forming the latent image pattern), for example, such as a laser beam to remove the resist film on the substrate. The mark formation units 18 may, however, form the AMF marks 31, 32, and 33 by using the light from the light source 11 by exposing the resist film on the substrate with an overdose.

Figure 3B:
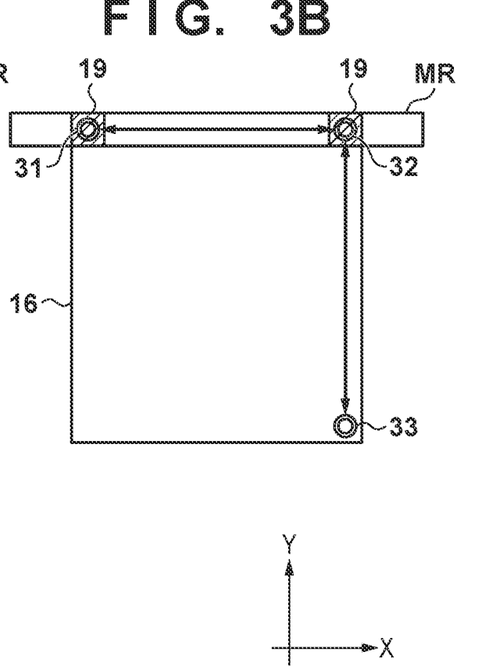

FIG. 3B shows a state (step S204) in which the AMF marks 31 and 32 formed on the resist film on the substrate are detected by the mark measurement units 19. In this embodiment, each mark measurement unit 19 includes an off-axis scope (OAS) that detects the AMF marks 31, 32, and 33 by using light (non-exposure light) of a wavelength different from the wavelength of light from the light source 11. Since each mark measurement unit 19 uses non-exposure light in this manner, it can measure the positions of the AMF marks 31, 32, and 33 without exposing the resist film on the substrate.

Note that although the exposure apparatus 1 includes two mark formation units 18 and two mark measurement units 19 as shown in FIG. 1 and FIGS. 3A to 3D, the number of the mark formation units 18 and the number of the mark measurement units 19 each are not limited to a specific value. An appropriate number of mark formation units 18 and mark measurement units 19 can be arranged in accordance with the number and the positions of the AMF marks to be formed on the resist film on the substrate and the time required to measure the positions of the AMF marks.

Figure 3C:
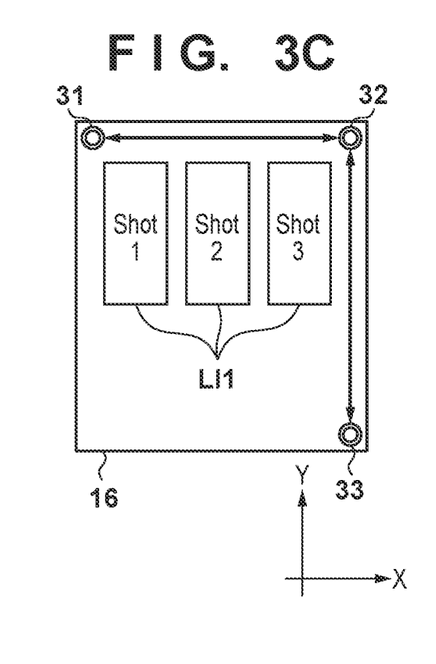

FIG. 3C shows the substrate 16 in a state (step S205) after the execution of the first exposure process. As shown in FIG. 3C, a latent image pattern (exposed image) LI1 is formed on the resist film on the substrate by projecting the pattern of the mask 13 onto the target position on the resist film on the substrate based on the positions of the AMF marks 31, 32, and 33 measured by the mark measurement units 19. The substrate 16 that underwent the first exposure process is collected from the substrate stage 17. At this time, the control unit 20 will obtain the relative positional relationships between the AMF marks 31, 32, and 33 and the latent image pattern LI1.

Figure 3D:
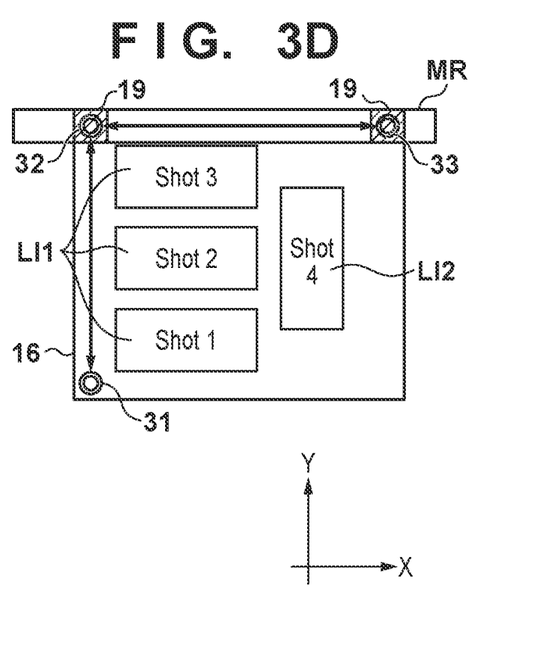

FIG. 3D shows the substrate 16 in a state (step S209) after the execution of the second exposure process. The substrate 16 that underwent the first exposure process and was collected from the substrate stage 17 is, for example, rotated 90° by the substrate conveying apparatus and held in this state by the substrate stage 17. Although the exposure apparatus 1 which performed the first exposure process will perform the second exposure process in this embodiment, the second exposure process may be performed in another exposure apparatus different from the exposure apparatus 1.

After the substrate 16 that underwent the first exposure process is held by the substrate stage 17, the positions of the AMF marks 31, 32, and 33 are measured by the mark measurement units 19. Subsequently, the target position where a latent image pattern LI2 is to be formed on the resist film on the substrate in the second exposure process is determined based on the positions of the AMF marks 31, 32, and 33 and the relative positional relationships between the AMF marks 31, 32, and 33 and the latent image pattern LI1. The latent image pattern LI2 is formed on the resist film on the substrate by projecting the pattern of the mask 13 onto the determined target position.

In this manner, in a case in which the exposure process is performed over a plurality of times on a single layer, the relative positional relationships between the AMF marks 31 to 33 and the latent image pattern LI1 and the relative positional relationships between the AMF marks 31 to 33 and the latent image pattern LI2 will be managed.

In the exposure apparatus 1, an abnormality may occur in the resist film on the substrate or in the exposure condition (exposure state) at the time of the exposure process in some cases. In such a case, in order to prevent the generation of a defect in a device to be manufactured from the substrate 16, a process to remove the resist film (first resist film) already formed on the substrate 16 and to form (regenerate) a new resist film (second resist film) on the substrate will be performed. The substrate 16 on which a resist film has been regenerated in this manner is called a "reworked substrate" and is reused. The substrate 16 with a regenerated resist film will be referred to as a reworked substrate 16A hereinafter.

Figure 4A:
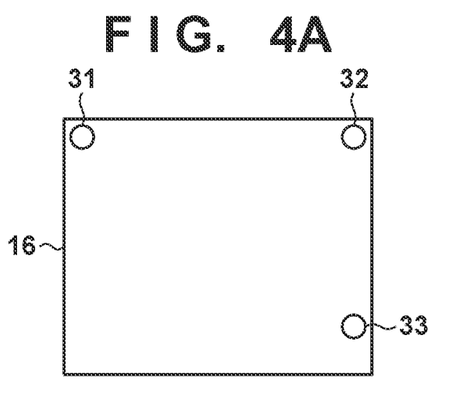
FIGS. 4A to 4F are views for explaining an exposure process performed on a reworked substrate according to the first embodiment.
Figure 4B:
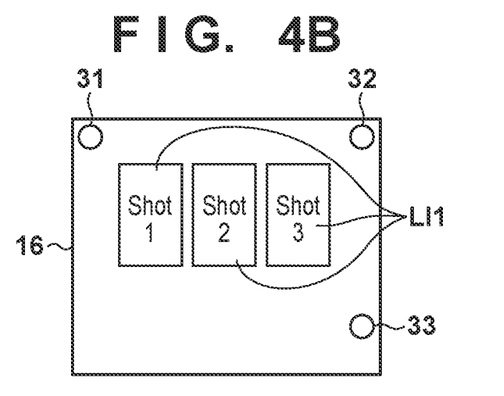

The reworked substrate and the exposure process performed on the reworked substrate according to this embodiment will be described with reference to FIGS. 4A to 4F. As shown in FIG. 4A, the three AMF marks 31, 32, and 33 have been formed on the resist film on the substrate by the mark formation units 18 before an exposure process is performed on the substrate 16. As shown in FIG. 4B, the latent image pattern LI1 is formed by projecting the pattern of the mask 13 onto a target position on the resist film on the substrate based on the positions of the AMF marks 31, 32, and 33 measured by the mark measurement units 19. Note that various kinds of correction amounts need to be obtained in order to form the latent image pattern LI1 at the target position on the resist film on the substrate. The correction amounts include, for example, a correction amount of the layout of the shot regions on the substrate that can be obtained from the amounts of shift with respect to the designed values of the positions of the AMF marks 31, 32, and 33 measured by the mark measurement units 19 and a drive correction amount of the substrate stage 17.

Figure 4C:
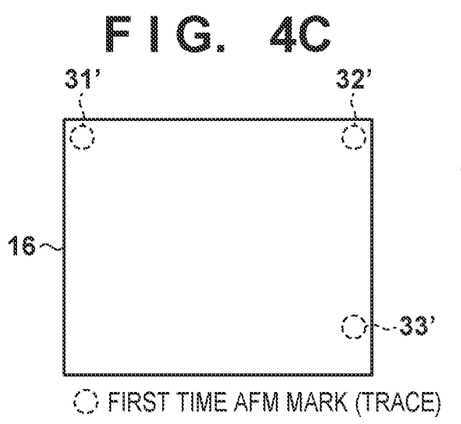

If an abnormality occurs in the resist film on the substrate or in the exposure condition in the exposure process shown in FIG. 4B here, the resist film on the substrate is removed as described above. Accordingly, although the latent image pattern LI1 will be removed together with the resist film, traces of the respective AMF marks 31, 32, and 33, that is, mark traces 31', 32', and 33' will remain on the substrate as shown in FIG. 4C. This is because the properties of the surface of the substrate 16 may have changed due to the formation of the AMF marks 31, 32, and 33 even if there is no defect on the substrate. If new AMF marks are formed overlapping the mark traces 31', 32', and 33' on the substrate 16, the detection accuracy of the new AMF marks may decrease, and it may become impossible to detect the new AMF marks due to the change in the properties of the surface of the substrate 16.

Figure 4D:
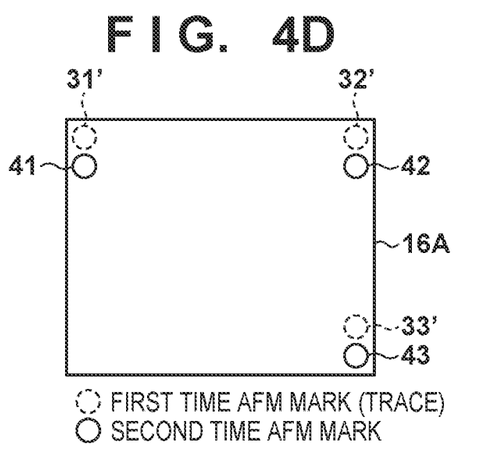

Hence, in this embodiment, as shown in FIG. 4D, when AMF marks are to be formed on a reworked substrate 16A, more specifically, on the resist film on the reworked substrate, AMF marks 41, 42, and 43 are formed at positions shifted from the mark traces 31', 32', and 33'. In other words, the mark formation units 18 will perform the formation process of forming the AMF marks 41 to 43 so that the AMF marks 41 to 43 (second marks) will be positioned at positions shifted from the positions of the mark traces 31' to 33' (first marks) on the reworked substrate 16A. In this case, it is preferable to form the AMF marks 41 to 43 so the positions of the AMF marks 41 to 43 on the reworked substrate 16A do not overlap the mark traces 31', 32', and 33'. This can suppress (prevent) a state in which the detection accuracy of the new AMF marks 41, 42, and 43 is degraded or a state in which it becomes impossible to detect the new AMF marks 41, 42, and 43. In addition, it is preferable to form the AMF marks 41, 42, and 43 so that the mark traces 31', 32', and 33' will be outside the measuring range of the AMF marks 41, 42, and 43 when the positions of the AMF marks 41, 42, and 43 are to be measured by the mark measurement units 19. This can suppress (prevent) the mark measurement units 19 from erroneously detecting the mark traces 31', 32', and 33'.

Figure 4E:
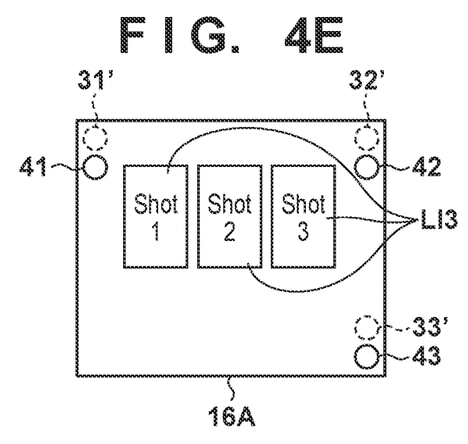

After the AMF marks 41 to 43 are formed on the resist film on the reworked substrate, the pattern of the mask 13 is projected onto the target position on the resist film on the reworked substrate, as shown as in FIG. 4E, based on the positions of the AMF marks 41 to 43 measured by the mark measurement units 19. As a result, a latent image pattern LI3 is formed on the resist film on the reworked substrate.

Figure 4F:
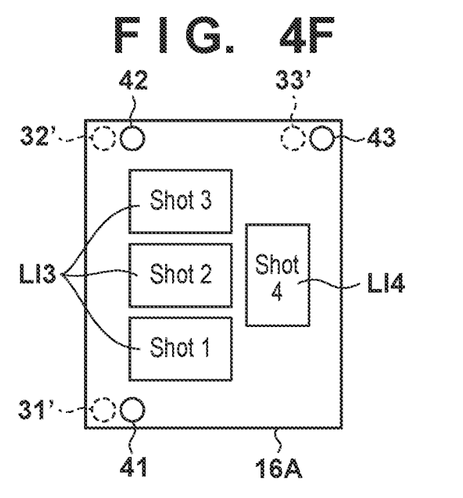

The reworked substrate 16A on which the latent image pattern LI3 has been formed is rotated 90° by, for example, the substrate conveying apparatus (not shown) and is held by the substrate stage 17 in this state. Subsequently, as shown in FIG. 4F, the pattern of the mask 13 is projected onto the target position on the resist film on the reworked substrate based on the positions of the AMF marks 41 to 43 measured by the mark measurement units 19. As a result, a latent image pattern LI4 is formed on the resist film on the reworked substrate.

Although the exposure processes for forming the latent image pattern LI3 and the latent image pattern LI4 are performed in the exposure apparatus 1 (the same exposure apparatus) in this embodiment, the present invention is not limited to this. For example, the exposure process for forming the latent image pattern LI3 and the exposure process for forming the latent image pattern LI4 may be performed in different exposure apparatuses.

Also, in this embodiment, the mark formation units 18 form the three AMF marks 41 to 43 on the resist film on the reworked substrate. This is done to obtain the positions in the rotation direction from the positions of the AMF marks 41 to 43 in addition to the positions in the translation direction of the reworked substrate 16A. Therefore, it is preferable to form at least three AMF marks on the resist film on the reworked substrate.

In addition, from the point of view of the measurement accuracy of the positions of the AMF marks, it is preferable to make the distances between the at least three AMF marks to be formed on the resist film on the reworked substrate longer than predetermined distances. It is also preferable for the number of AMF marks to be formed on the resist film on the reworked substrate to be the same as the number of AMF marks which were formed on the resist film on the substrate before the rework. Furthermore, it is preferable for the relative distances between the plurality of AMF marks to be formed on the resist film on the reworked substrate to be equal to the relative distances between the plurality of AMF marks formed on the resist film on the substrate before the rework.

Second Embodiment

Figure 5:
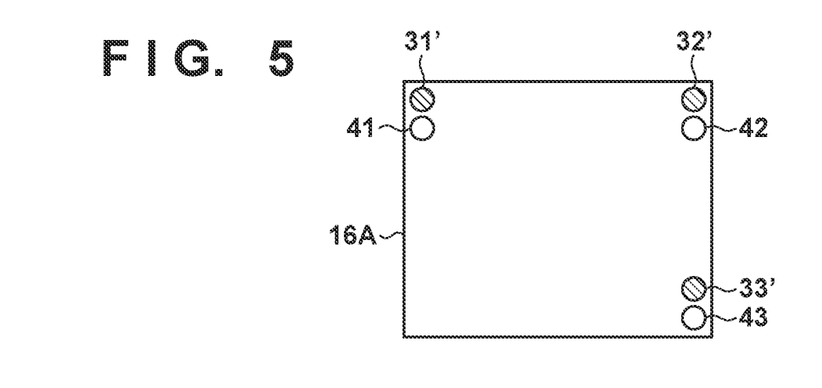
FIG. 5 is a view showing mark traces on the reworked substrate and AMF marks formed on the reworked substrate.

As shown in FIG. 5, traces of AMF marks 31, 32, and 33, that is, mark traces 31', 32', and 33', respectively, remain on a reworked substrate 16A. There is a possibility that the mark traces 31', 32', and 33' can be detected by mark measurement units 19. In other words, there may be a case in which the positions of the mark traces 31', 32', and 33' can be measured by the mark measurement units 19. Hence, in this embodiment, whether to form new AMF marks 41, 42, and 43 will be determined in accordance with whether the mark measurement units 19 can measure the positions of the mark traces 31', 32', and 33' remaining on the reworked substrate 16A.

Figure 6:
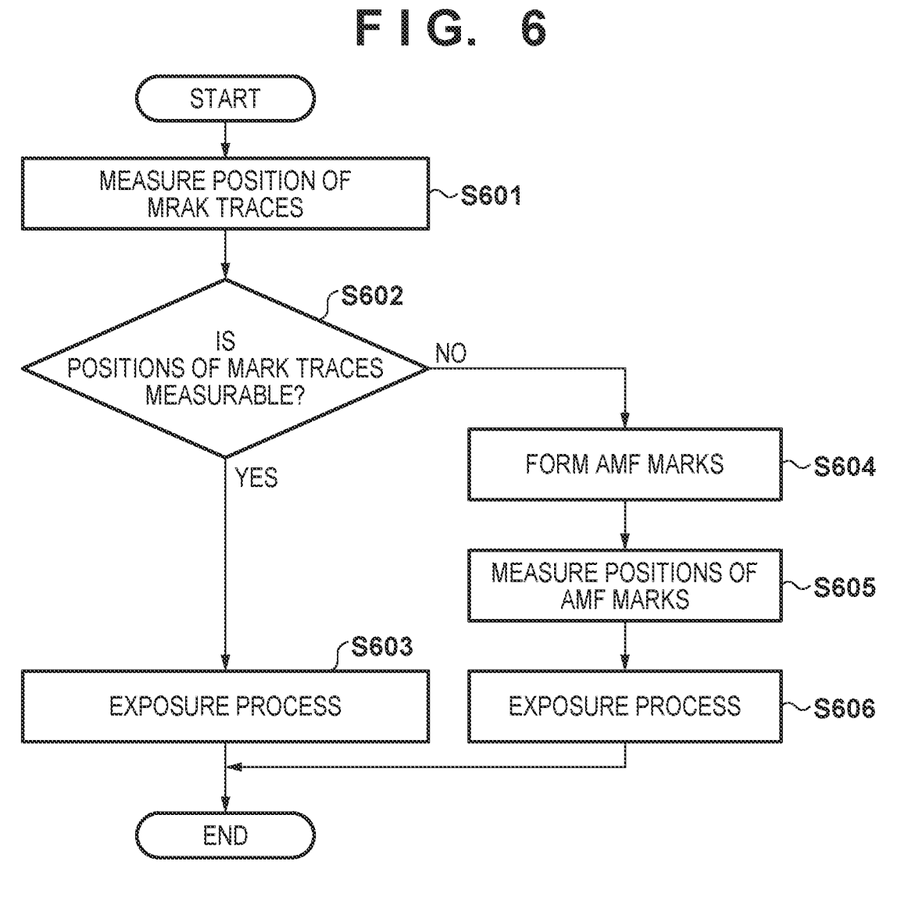
FIG. 6 is a flowchart for explaining processing performed with respect to a reworked substrate according to the second embodiment.

As shown in FIG. 6, in step S601, the mark measurement units 19 measure the positions of the mark traces 31', 32', and 33' remaining on the reworked substrate 16A. In step S602, whether the mark measurement units 19 can measure the positions of the mark traces 31', 32', and 33' is determined based on the measurement result obtained in step S601.

If the mark measurement units 19 can measure the positions of the mark traces 31', 32', and 33', the process advances to step S603. In step S603, an exposure process is performed to form a latent image pattern by projecting the pattern of a mask 13 onto a target position on the resist film on the reworked substrate based on the positions of the mark traces 31', 32', and 33' measured in step S601.

On the other hand, if the mark measurement units 19 cannot measure the positions of the mark traces 31', 32', and 33', the process advances to step S604. In step S604, the AMF marks 41, 42, and 43 are formed at positions shifted from the mark traces 31', 32', and 33'. More specifically, mark formation units 18 perform, as described above, a formation process to form the AMF marks 41 to 43 so that the AMF marks 41 to 43 will be positioned at positions shifted from the positions of the mark traces 31' to 33' on the reworked substrate 16A.

In step S605, the mark measurement units 19 measure the positions of the AMF marks 41, 42, and 43 formed on the resist film on the reworked substrate in step S604. In step S606, the exposure process is performed to form a latent image pattern by projecting the pattern of the mask 13 onto the target position of the resist film on the reworked substrate based on the positions of the AMF marks 41, 42, and 43 measured in step S605.

Although it is assumed in this embodiment that the mark measurement units 19 will be able to measure the new AMF marks, that is, the positions of the second AMF marks formed on the resist film on the reworked substrate, there may be a case in which the positions of the second AMF marks cannot be measured. In such a case, whether the positions of the second AMF marks can be measured can be determined, and new AMF marks (third AMF marks) can be formed in a case in which the positions of the second AMF marks cannot be measured. In other words, Nth AMF marks can be formed in a case in which the positions of (N−1)th AMF marks cannot be measured after determining whether the positions of the (N−1)th AMF marks can be measured.

The embodiment is not limited to the reworked substrate 16A. The embodiment is applicable to a case in which AMF marks cannot be measured even if the reworked substrate 16A is not used. For example, whether the mark measurement units 19 can measure the positions of the AMF marks (first marks) formed on the resist film on a substrate 16 is determined. If the mark measurement units 19 cannot measure the positions of the AMF marks formed on the resist film on the substrate 16, new AMF marks (second marks) will be formed in positions shifted from the positions of the AMF marks on the resist film of the substrate 16. Subsequently, an exposure process is performed to form a latent image pattern by projecting the pattern of the mask 13 onto the target position on the resist film on the substrate 16 based on the positions of the new AMF marks measured by the mark measurement units 19.

Third Embodiment

Figure 7:
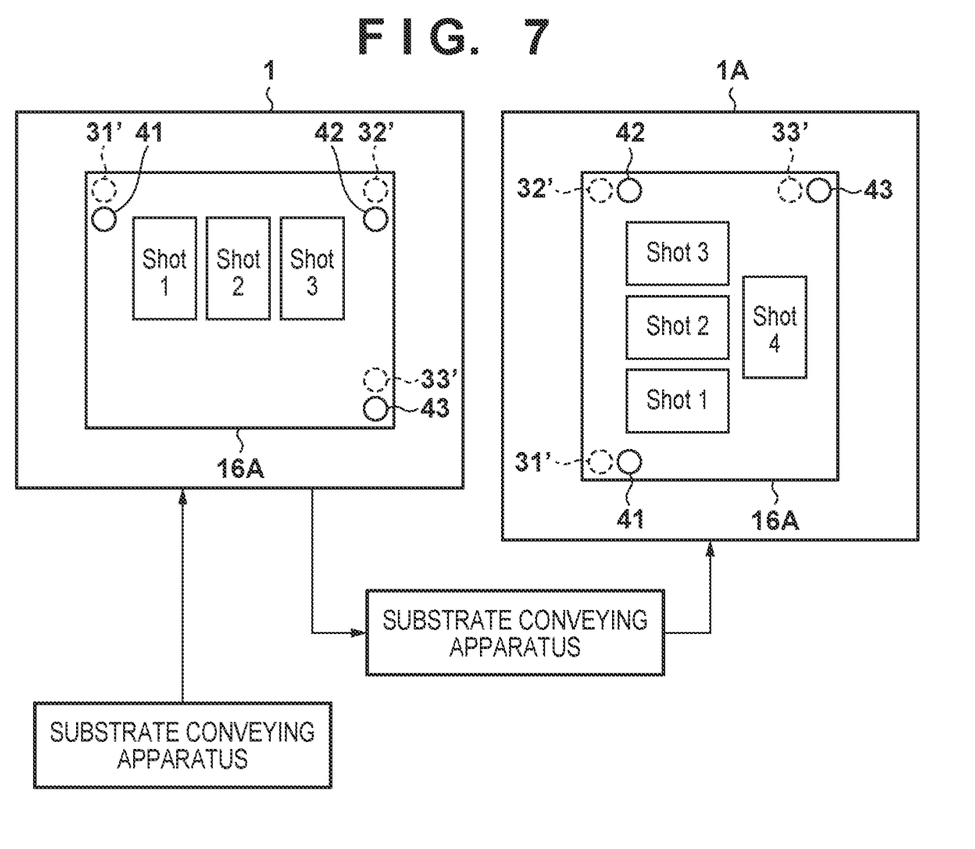
FIG. 7 is a view showing the concept of an exposure process performed on a reworked substrate according to the third embodiment.

This embodiment will describe, as shown in FIG. 7, a case in which an exposure apparatus 1 performs the first exposure process on a reworked substrate 16A and an exposure apparatus 1A different from the exposure apparatus 1 performs the second exposure process on the reworked substrate. The exposure apparatus 1A here has an identical arrangement and function as the exposure apparatus 1.

Figure 8:
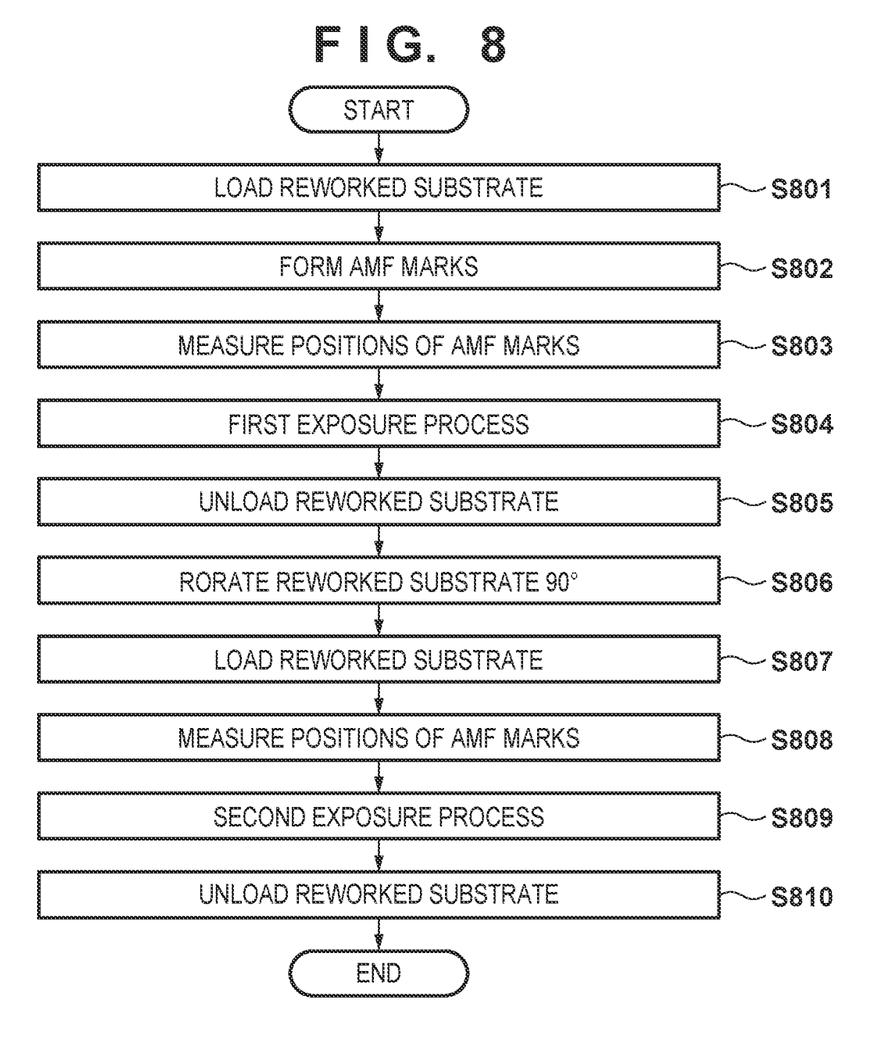
FIG. 8 is a flowchart for explaining the exposure process performed on the reworked substrate according to the third embodiment.

FIG. 8 is a flowchart for explaining an exposure process on a reworked substrate according to this embodiment. In step S801, the reworked substrate 16A is loaded into the exposure apparatus 1. More specifically, the reworked substrate 16A is loaded into the exposure apparatus 1 by a substrate conveying apparatus and is held by a substrate stage 17. At this time, the exposure apparatus 1 obtains position information related to positions of AMF marks 31 to 33 (mark traces 31', 32', and 33'), which were formed on the resist film of a substrate 16 before the rework, from an apparatus (another apparatus different from the exposure apparatus 1) that formed the AMF marks 31 to 33.

In step S802, in the exposure apparatus 1, AMF marks 41, 42, and 43 are formed at positions shifted from the mark traces 31', 32', and 33' remaining on the reworked substrate 16A. More specifically, a formation process is performed, based on the position information obtained in step S801, to form the AMF marks 41 to 43 so that the AMF marks 41 to 43 will be positioned at positions shifted from the positions of the mark traces 31' to 33' on the reworked substrate 16A.

In step S803, in the exposure apparatus 1, the positions of the AMF marks 41, 42, and 43 formed on the resist film on the reworked substrate formed in step S802 are measured. In step S804, in the exposure apparatus 1, the first exposure process is performed on the reworked substrate 16A. More specifically, an exposure process is performed to form a latent image pattern by projecting the pattern of a mask 13 onto a target position on the resist film on the reworked substrate based on the positions of the AMF marks 41, 42, and 43 measured in step S803.

In step S805, the reworked substrate 16A is unloaded from the exposure apparatus 1. More specifically, the reworked substrate 16A that underwent the first exposure process is collected from the substrate stage 17 and is unloaded from the exposure apparatus 1 by the substrate conveying apparatus. In step S806, the reworked substrate 16A held by the substrate conveying apparatus is rotated 90°.

In step S807, the reworked substrate 16A is loaded into the exposure apparatus 1A. More specifically, the reworked substrate 16A that has been rotated 90° is loaded into the exposure apparatus 1A by the substrate conveying apparatus in this state. At this time, the exposure apparatus 1A obtains the position information related to the positions of the AMF marks 41 to 43, which are formed on the resist film on the reworked substrate 16A, from the exposure apparatus 1.

In step S808, in the exposure apparatus 1A, the positions of the AMF marks 41, 42, and 43 formed on the resist film on the reworked substrate in step S802 are measured. In step S809, in the exposure apparatus 1A, the second exposure process is performed on the reworked substrate 16A. More specifically, an exposure process is performed to form a latent image pattern by projecting the pattern of the mask 13 onto the target position on the resist film on the reworked substrate based on the positions of the AMF marks 41, 42, and 43 measured in step S808.

In step S810, the reworked substrate 16A is unloaded from the exposure apparatus 1A. More specifically, the reworked substrate 16A that underwent the first exposure process and the second exposure process is unloaded from the exposure apparatus 1A by the substrate conveying apparatus.

Fourth Embodiment

A method of manufacturing an article according to the embodiments of the present invention is suitable for manufacturing an article, for example, a device (a semiconductor element, a magnetic storage medium, a liquid crystal display element, or the like) or the like. The method of manufacturing an article includes a step of exposing a substrate, on which a photoresist has been applied, by using an exposure apparatus 1 or the exposure apparatus 1 and an exposure apparatus 1A and a step of developing the exposed substrate. Furthermore, this manufacturing method can include other well-known steps (for example, oxidization, deposition, vapor deposition, doping, planarization, etching, resist removal, dicing, bonding, and packaging, and the like). The method of manufacturing an article according to the embodiments is superior to a conventional method in at least one of performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2018-071919 filed on Apr. 3, 2018, which is hereby incorporated by reference herein in its entirety.

What is claimed is:

1. A mark forming apparatus comprising:
a light source;
an alignment mark former; and
a controller including a processor configured to execute computer readable instructions stored in memory and/or a circuit and being configured to cause the alignment mark former to form a mark on a resist film on a reworked substrate using light emitted from the light source, the reworked substrate being a substrate on which a first resist film, on which a first mark has been formed, has been removed and a second resist film has been formed, the reworked substrate including a first mark trace at a position corresponding to a position of the first mark on the first resist film,
wherein the controller is configured to cause the alignment mark former to form a second mark on the second resist film so that the second mark is positioned at a position shifted from the position where the first mark trace is formed on the reworked substrate.

2. The apparatus according to claim 1, wherein in the controller is configured to cause the alignment mark former to form at least three second marks on the second resist film.

3. The apparatus according to claim 2, wherein the controller is configured to cause the alignment mark former to form the at least three second marks so that distances between the at least three second marks to be formed on the second resist film will be longer than predetermined distances.

4. The apparatus according to claim 1, wherein the controller is configured to cause the alignment mark former to form, on the second resist film, a number of a plurality of second marks equal to a number of a plurality of first marks formed on the first resist film.

5. The apparatus according to claim 4, wherein the controller is configured to cause the alignment mark former to form the plurality of second marks so that relative distances between the plurality of the second marks to be formed on the second resist film are equal to the relative distances between the plurality of first marks formed on the first resist film.

6. The apparatus according to claim 1, wherein the controller is configured to cause the alignment mark former to form the second mark on the second resist film so that the position of the second mark does not overlap the position of the first mark on the reworked substrate.

7. The apparatus according to claim 1, further comprising a measurer configured to measure a position of the mark formed by the alignment mark former,
wherein the controller is configured to cause the alignment mark former to form the second mark on the second resist film so that the position of the first mark which was formed on the first resist film falls outside a measuring range of the measurer when the position of the second mark is to be measured by the measurer.

8. The apparatus according to claim 1, wherein the controller is configured to cause the alignment mark former to form the second mark on the second resist film by using light having a wavelength different from a wavelength of light used in an exposure process to form a latent image by projecting a pattern onto the resist film on the substrate.

9. The apparatus according to claim 1, wherein the first mark is formed on the first resist film by the alignment mark former.

10. A method of manufacturing an article, comprising:
removing a first resist film, on which a first mark has been formed, from a substrate and forming a second resist film on the substrate;
forming a second mark on a reworked substrate on which the second resist film has been formed;
exposing the reworked substrate on which the second mark has been formed;
developing the reworked substrate exposed in the exposing; and
manufacturing an article from the reworked substrate developed in the developing,
wherein in the forming the second mark, the second mark is formed at a position shifted from a position of a first mark trace that coincides with a position where the first mark has been formed on the reworked substrate.

11. An exposure apparatus comprising:
a light source;
an alignment mark former; and
a controller including a processor configured to execute computer readable instructions stored in memory and/or a circuit, and being configured to cause the alignment mark former to form a mark on a resist film on a reworked substrate using light emitted from the light source, the reworked substrate being a substrate on which a first resist film, on which a first mark has been formed, has been removed and a second resist film has been formed, the reworked substrate including a first mark trace at a position corresponding to a position of the first mark on the first resist film,
wherein the controller is configured to cause the alignment mark former to form a second mark on the second resist film so that the second mark is positioned at a position shifted from the position where the first mark trace is formed on the reworked substrate.

12. The apparatus according to claim 11,
wherein the first mark is formed by another apparatus different from the exposure apparatus, and
the controller obtains, from the another apparatus, position information related to the position of the first mark which was formed on the first resist film, and
in the formation process, the controller causes the alignment mark former to form the second mark on the second resist film based on the position information.

13. A mark forming method, comprising:
forming a mark on a resist film on a reworked substrate, the reworked substrate being a substrate on which a first resist film, on which a first mark has been formed, has been removed and a second resist film has been formed, the reworked substrate including a first mark trace at a position corresponding to a position of the first mark on the first resist film,
wherein the forming forms a second mark on the second resist film so that the second mark is positioned at a position shifted from the position where the first mark trace is formed on the reworked substrate.

* * * * *